United States Patent
Wang

(10) Patent No.: US 12,402,538 B2
(45) Date of Patent: Aug. 26, 2025

(54) MAGNETIC MEMORY DEVICE AND FABRICATION METHOD THEREOF

(71) Applicant: UNITED MICROELECTRONICS CORP., Hsin-Chu (TW)

(72) Inventor: Hui-Lin Wang, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 507 days.

(21) Appl. No.: 17/903,998

(22) Filed: Sep. 6, 2022

(65) Prior Publication Data

US 2024/0057483 A1 Feb. 15, 2024

(30) Foreign Application Priority Data

Aug. 15, 2022 (TW) .................. 111130593

(51) Int. Cl.
*H10N 50/01* (2023.01)
*H10N 50/10* (2023.01)
*H10N 50/80* (2023.01)

(52) U.S. Cl.
CPC ............. *H10N 50/80* (2023.02); *H10N 50/01* (2023.02)

(58) Field of Classification Search
CPC ......... H10N 50/80; H10N 50/01; H10N 50/10
See application file for complete search history.

(56) References Cited

U.S. PATENT DOCUMENTS

| | | | |
|---|---|---|---|
| 6,624,987 B1* | 9/2003 | Hayashi | B82Y 10/00 |
| | | | 360/324.2 |
| 2010/0301436 A1* | 12/2010 | Sashida | H10D 1/682 |
| | | | 438/653 |
| 2015/0228891 A1* | 8/2015 | Park | H10N 50/01 |
| | | | 257/421 |
| 2018/0358547 A1* | 12/2018 | Yang | H10B 61/10 |
| 2023/0127582 A1* | 4/2023 | Ducruet | H10N 50/85 |
| | | | 257/421 |
| 2023/0403948 A1* | 12/2023 | Peng | H10N 50/80 |

* cited by examiner

*Primary Examiner* — Omar F Mojaddedi
(74) *Attorney, Agent, or Firm* — Winston Hsu

(57) ABSTRACT

A magnetic memory device includes a bottom electrode layer, a magnetic tunneling junction (MTJ) stack disposed on the bottom electrode layer, a capping layer disposed on the MTJ stack, and a top electrode layer disposed on the capping layer. The top electrode layer comprises $RuO_2$.

10 Claims, 4 Drawing Sheets

MAGNETIC MEMORY DEVICE AND FABRICATION METHOD THEREOF

BACKGROUND OF THE INVENTION

1. Field of the Invention

The present invention relates to a magnetic memory device and a manufacturing method thereof, in particular to a magnetoresistive random access memory (MRAM) device and a manufacturing method thereof.

2. Description of the Prior Art

A magnetoresistive random access memory (MRAM) is a kind of non-volatile memory that has drawn a lot of attention in this technology field recently regarding its potentials of incorporating advantages of other kinds of memories. For example, a MRAM device may have an operation speed comparable to SRAMs, the non-volatile feature and low power consumption comparable to flash, the high integrity and durability comparable to DRAM. More important, the process for forming a MRAM device may be conveniently incorporated into existing semiconductor manufacturing processes.

A typical MRAM cell structure usually includes a memory stack structure including a magnetic tunneling junction (MTJ) disposed between the lower and upper electrodes. Unlike conventional memories that store data by electric charge or current flow, an MRAM cell stores data by applying external magnetic fields to control the magnetic polarity and tunneling magnetoresistance (TMR) of the MTJ. A well-controlled tunneling magnetoresistance of an MRAM cell is critical for the MRAM cell to function properly. It is important to prevent impurities (such as ambient gas or elements of other material layers) from diffusing into the MTJ of the MRAM cell when manufacturing a magnetoresistive random access memory because the diffused impurities may cause abnormal tunneling magnetoresistance.

SUMMARY OF THE INVENTION

It is one object of the present invention to provide an improved magnetic memory device and a manufacturing method thereof to solve the deficiencies or shortcomings of the prior art.

One aspect of the invention provides a magnetic memory device including a bottom electrode layer; a magnetic tunneling junction (MTJ) stack disposed on the bottom electrode layer; a capping layer disposed on the MTJ stack; and a top electrode layer disposed on the capping layer, wherein the top electrode layer comprises $RuO_2$.

According to some embodiments, the capping layer comprises a MgO layer.

According to some embodiments, the capping layer comprises a TaN layer on the MgO layer.

According to some embodiments, the capping layer comprises a diffusion barrier layer between the TaN layer and the MgO layer.

According to some embodiments, the diffusion barrier layer comprises a $RuO_2$ layer.

According to some embodiments, the diffusion barrier layer further comprises a Ru layer between the TaN layer and the $RuO_2$ layer.

According to some embodiments, the magnetic memory device further includes a hard mask layer disposed on the top electrode layer.

According to some embodiments, the hard mask layer comprises TiN.

According to some embodiments, the top electrode layer further comprises Ru.

According to some embodiments, the bottom electrode layer comprises TaN.

Another aspect of the invention provides a method for fabricating a magnetic memory device. A bottom electrode layer is formed. A magnetic tunneling junction (MTJ) stack is formed on the bottom electrode layer. A capping layer is formed on the MTJ stack. A top electrode layer is formed on the capping layer, wherein the top electrode layer comprises $RuO_2$.

According to some embodiments, the capping layer comprises a MgO layer.

According to some embodiments, the capping layer comprises a TaN layer on the MgO layer.

According to some embodiments, the capping layer comprises a diffusion barrier layer between the TaN layer and the MgO layer.

According to some embodiments, the diffusion barrier layer comprises a $RuO_2$ layer.

According to some embodiments, the diffusion barrier layer further comprises a Ru layer between the TaN layer and the $RuO_2$ layer.

According to some embodiments, the method further includes the step of forming a hard mask layer on the top electrode layer.

According to some embodiments, the hard mask layer comprises TiN.

According to some embodiments, the top electrode layer further comprises Ru.

According to some embodiments, the bottom electrode layer comprises TaN.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Figure 1:
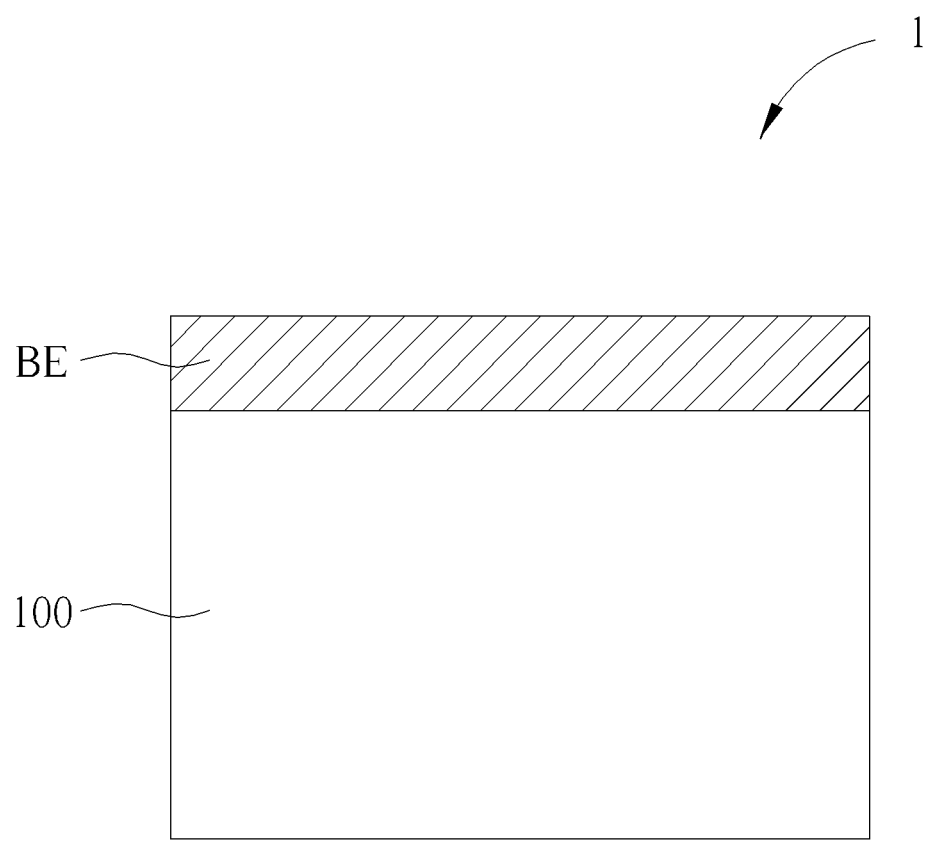
FIG. 1 to FIG. 4 are schematic diagrams illustrating a method of manufacturing a magnetic memory device according to an embodiment of the present invention.

Please refer to FIG. 1 to FIG. 4, which are schematic diagrams of a method for manufacturing a magnetic memory device 1 according to an embodiment of the present invention. According to an embodiment of the present invention, the magnetic memory device 1 is a magnetoresistive random access memory (MRAM) device. As shown in FIG. 1, a substrate 100, for example, a semiconductor substrate is provided. Next, a bottom electrode layer BE is formed on the substrate 100. According to an embodiment of the present invention, the bottom electrode layer BE may comprise TaN, but is not limited thereto.

Figure 2:
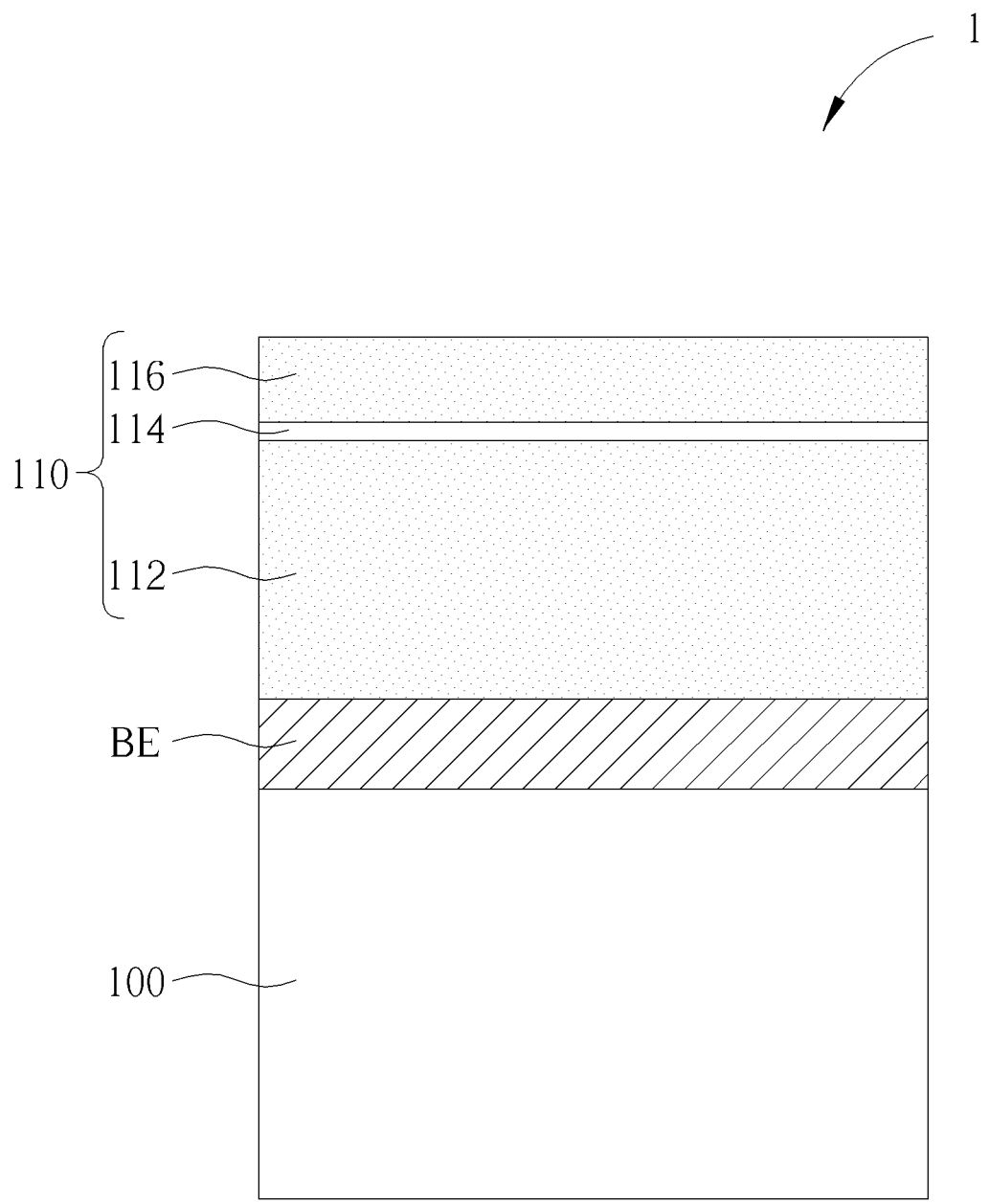

As shown in FIG. 2, a magnetic tunnel junction (MTJ) stack 110 is then formed on the bottom electrode layer BE. According to an embodiment of the present invention, the MTJ stack 110 may include a reference layer 112, a tunnel barrier layer 114 and a free layer 116, but is not limited thereto. According to an embodiment of the present invention, the reference layer 112 and the free layer 116 may be formed of a ferromagnetic material, and the tunneling layer 114 may be formed of an insulating material, but not limited thereto.

Figure 3:
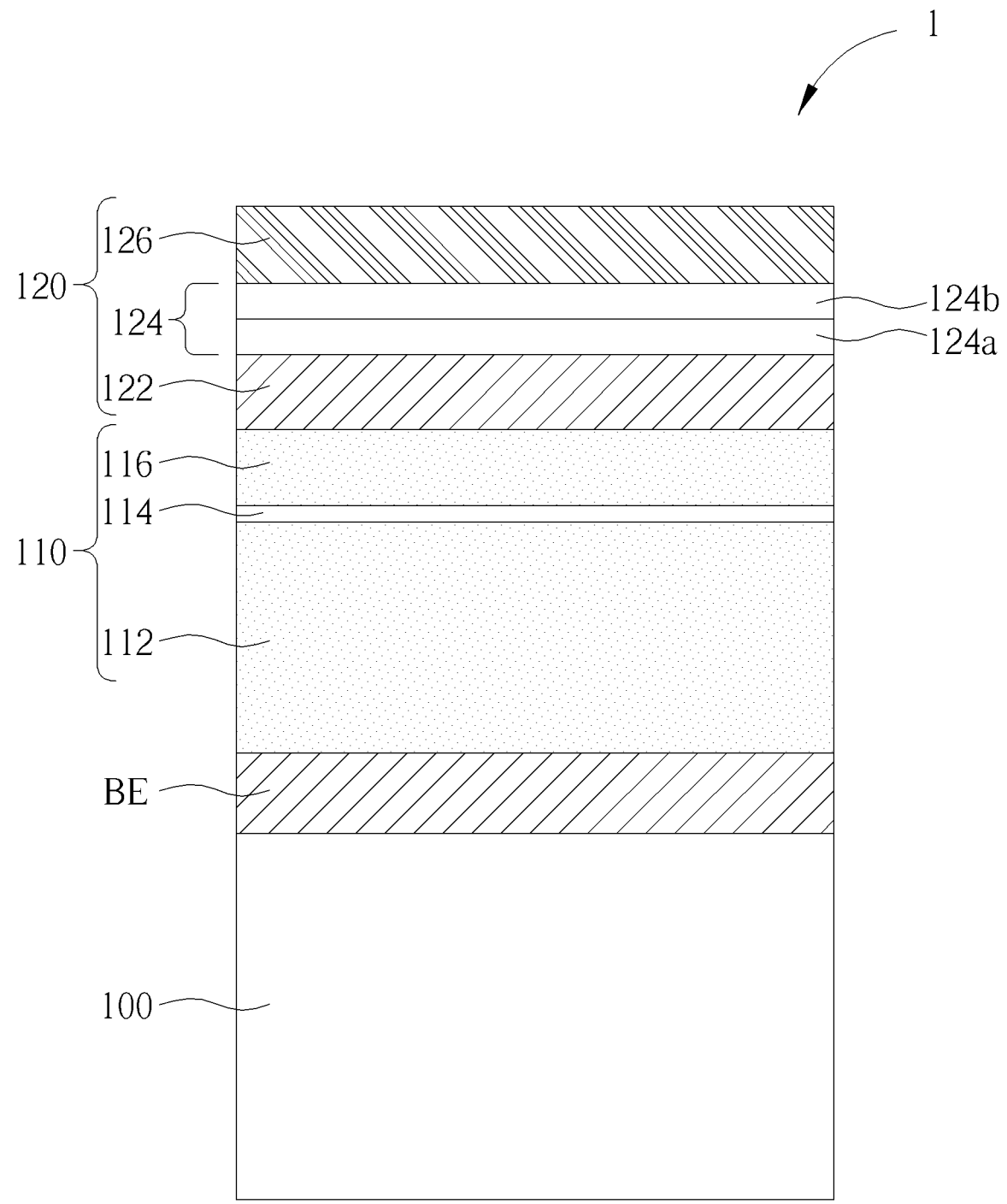

As shown in FIG. 3, a capping layer 120 is then formed on the MTJ stack 110. According to an embodiment of the present invention, the capping layer 120 includes an MgO layer 122. According to an embodiment of the present invention, the capping layer 120 includes a TaN layer 126 on the MgO layer 122. The capping layer 120 includes a diffusion barrier layer 124 between the TaN layer 126 and the MgO layer 124 in accordance with an embodiment of the present invention. According to an embodiment of the present invention, the diffusion barrier layer 124 includes a $RuO_2$ layer 124a. According to an embodiment of the present invention, the diffusion barrier layer 124 further includes a Ru layer 124b between the TaN layer 126 and the $RuO_2$ layer 124a. The Ru layer 124b can reduce the resistance of the diffusion barrier layer 124. The $RuO_2$ layer 124a may block the diffusion of Ru atoms in the Ru layer 124b, and may block the diffusion of Ti or N atoms.

According to another embodiment of the present invention, the diffusion barrier layer 124 may only have a $RuO_2$ layer 124a. According to yet another embodiment of the present invention, the diffusion barrier layer 124 may comprise another $RuO_2$ layer disposed between the Ru layer 124b and the TaN layer 126 as a hard mask and may block the diffusion of Ru, Ti or N atoms.

Figure 4:
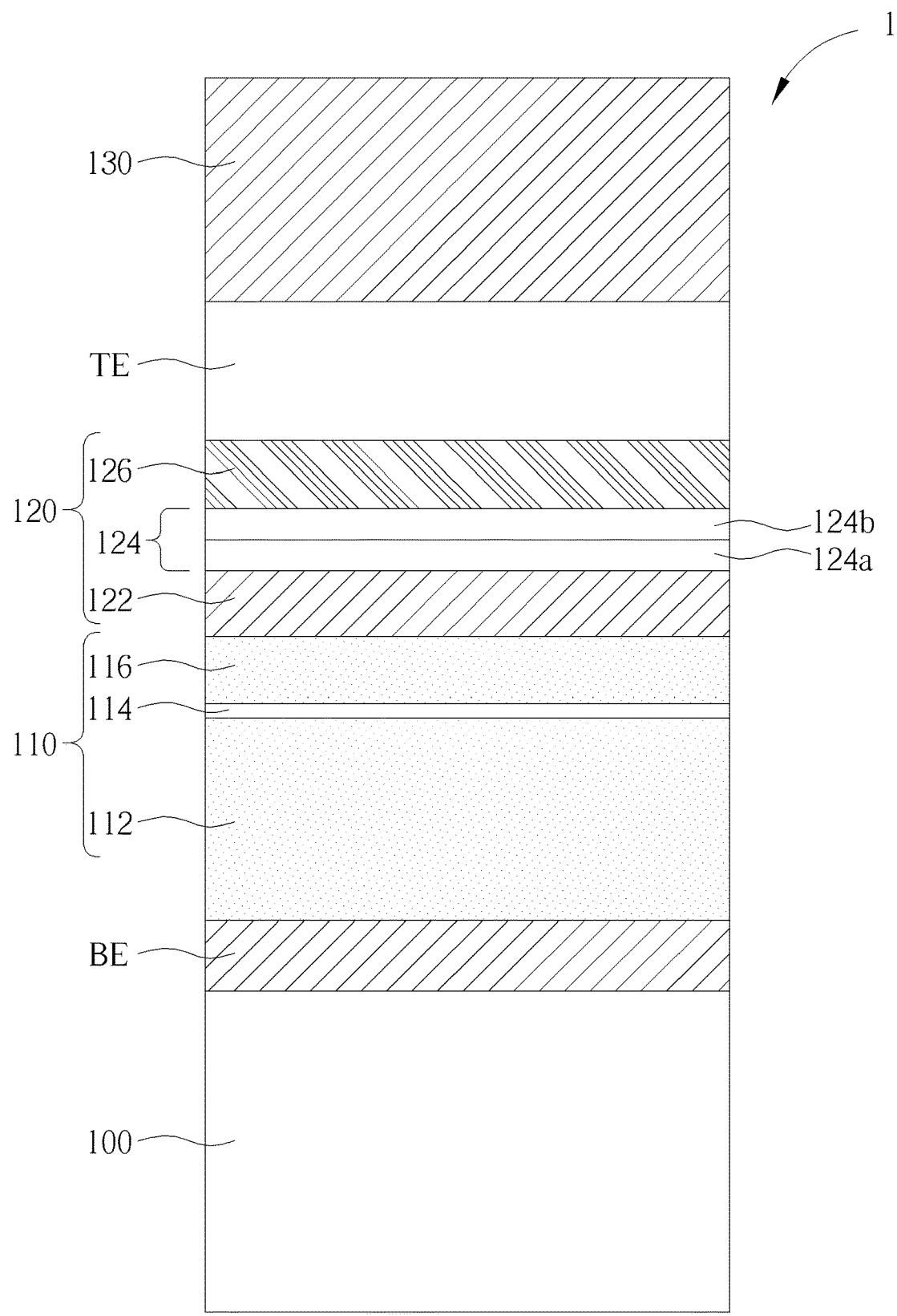

As shown in FIG. 4, a top electrode layer TE is then formed on the TaN layer 126 of the capping layer 120. According to an embodiment of the present invention, the top electrode layer TE includes $RuO_2$. According to an embodiment of the present invention, the top electrode layer TE further includes Ru. According to an embodiment of the present invention, the top electrode layer TE may only contain $RuO_2$. According to another embodiment of the present invention, the top electrode layer TE may include two or more layers of $RuO_2$, for example, a sandwich structure in which two layers of $RuO_2$ sandwich a layer of Ru metal. According to an embodiment of the present invention, finally, a hard mask layer 130 is formed on the top electrode layer TE. According to an embodiment of the present invention, the hard mask layer 130 may include TiN.

Structurally, as shown in FIG. 4, the magnetic memory device 1 includes a bottom electrode layer BE. According to an embodiment of the present invention, the bottom electrode layer BE includes TaN. The MTJ stack 110 is disposed on the bottom electrode layer BE. The capping layer 120 is disposed on the MTJ stack 110. The top electrode layer TE is disposed on the capping layer 120, wherein the top electrode layer TE includes $RuO_2$.

According to an embodiment of the present invention, the capping layer 120 includes an MgO layer 122. According to an embodiment of the present invention, the capping layer 122 includes a TaN layer 126 on the MgO layer 122. The capping layer 120 includes a diffusion barrier layer 124 between the TaN layer 126 and the MgO layer 122 in accordance with an embodiment of the present invention. According to an embodiment of the present invention, the diffusion barrier layer 124 includes a $RuO_2$ layer 124a. According to an embodiment of the present invention, the diffusion barrier layer 124 further includes a Ru layer 124b between the TaN layer 126 and the $RuO_2$ layer 124a.

According to an embodiment of the present invention, the magnetic memory device 1 further includes: a hard mask layer 130 disposed on the top electrode layer TE. According to an embodiment of the present invention, the hard mask layer 130 includes TiN. According to an embodiment of the present invention, the top electrode layer TE further includes Ru.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A magnetic memory device, comprising:
   a bottom electrode layer;
   a magnetic tunneling junction (MTJ) stack disposed on the bottom electrode layer;
   a capping layer disposed on the MTJ stack, wherein the capping layer comprises a MgO layer, a TaN layer on the MgO layer, and a diffusion barrier layer between the TaN layer and the MgO layer, wherein the diffusion barrier layer comprises a $RuO_2$ layer in direct contact with the MgO layer, and a Ru layer between the TaN layer and the $RuO_2$ layer, wherein the Ru layer is in direct contact with the TaN layer; and
   a top electrode layer disposed on the capping layer, wherein the top electrode layer comprises $RuO_2$.

2. The magnetic memory device according to claim 1 further comprising:
   a hard mask layer disposed on the top electrode layer.

3. The magnetic memory device according to claim 2, wherein the hard mask layer comprises TiN.

4. The magnetic memory device according to claim 1, wherein the top electrode layer further comprises Ru.

5. The magnetic memory device according to claim 1, wherein the bottom electrode layer comprises TaN.

6. A method for fabricating a magnetic memory device, comprising:
   forming a bottom electrode layer;
   forming a magnetic tunneling junction (MTJ) stack on the bottom electrode layer;
   forming a capping layer on the MTJ stack, wherein the capping layer comprises a MgO layer, a TaN layer on the MgO layer, and a diffusion barrier layer between the TaN layer and the MgO layer, wherein the diffusion barrier layer comprises a $RuO_2$ layer in direct contact with the MgO layer, and a Ru layer between the TaN layer and the $RuO_2$ layer, wherein the Ru layer is in direct contact with the TaN layer; and
   forming a top electrode layer on the capping layer, wherein the top electrode layer comprises $RuO_2$.

7. The method according to claim 6 further comprising:
   forming a hard mask layer on the top electrode layer.

8. The method according to claim 7, wherein the hard mask layer comprises TiN.

9. The method according to claim 6, wherein the top electrode layer further comprises Ru.

10. The method according to claim 6, wherein the bottom electrode layer comprises TaN.

* * * * *